US005619034A

United States Patent [19]

Reed et al.

[11] Patent Number: 5,619,034

[45] Date of Patent: Apr. 8, 1997

[54] DIFFERENTIATING MASS SPECTROMETER

[76] Inventors: David A. Reed, 2743 St. James Rd., Belmont, Calif. 94002; Paul W. Palmberg, 7424 Coventry Way, Edina, Minn. 55439

[21] Appl. No.: 559,489

[22] Filed: Nov. 15, 1995

[51] Int. Cl.[6] ..................... H01J 37/26

[52] U.S. Cl. ..................... 250/287; 250/286; 250/309

[58] Field of Search ..................... 250/287, 286, 250/283, 282, 281, 309

[56] References Cited

U.S. PATENT DOCUMENTS

| | | | |
|---|---|---|---|
| 4,778,993 | 10/1988 | Waugh | 250/287 |
| 4,983,831 | 1/1991 | Migeon et al. | 250/309 |
| 5,128,543 | 7/1992 | Reed et al. | 250/287 |
| 5,300,774 | 4/1994 | Buttrill, Jr. | 250/287 |
| 5,331,158 | 7/1994 | Dowell | 250/287 |
| 5,347,126 | 9/1994 | Krauss et al. | 250/309 |
| 5,360,976 | 11/1994 | Young et al. | 250/287 |
| 5,376,788 | 12/1994 | Standing et al. | 250/287 |

*Primary Examiner*—Jack I. Berman
*Assistant Examiner*—Kiet T. Nguyen
*Attorney, Agent, or Firm*—Robert Samuel Smith

[57] ABSTRACT

A Time of Flight Mass Spectrometer which features rastering the secondary beam on the surface and analyzing composition at each of the rastered locations thereby greatly increasing the rate of data throughput. The primary beam is rastered on the target surface and the secondary beam is rastered on the detector surface. The latter arrangement provides ways of interpreting data including mapping the distribution of selected species on the target surface. The secondary beam is generated from a gas. This latter arrangement is especially useful for studying reaction rams of mixtures of reactive gases.

31 Claims, 3 Drawing Sheets

DIFFERENTIATING MASS SPECTROMETER

FIELD OF THE INVENTION

This invention relates to Time of Flight Mass Spectrometers (TOFMS) and particularly to a TOFMS in which data acquisition time is improved by separating the secondary beam into an array of beams spatially arranged on the detector surface.

BACKGROUND AND INFORMATION DISCLOSURE

A TOFMS is an apparatus for analyzing the composition of a target by irradiating the target with a primary beam so as to eject particles from the target which are ionized and then directed as a secondary beam through a "drift" region to a detector. The target in some applications is the surface of a solid or liquid and in other applications is a gas injected into an ionization chamber. The velocity of various particles is proportional to the square root of the mass of the particle so that the composition of the drifting beam can be determined by measuring the time required by each species of particle to reach the detector.

Interpretation of the data is complicated by the fact that heavy particles released from the target at one instant must be distinguished from light (faster) particles released at a later instant. One approach to distinguishing between light and heavy particles is accomplished by applying the primary beam in pulses with sufficient time between pulses to enable all of the particles from one pulse to reach the detector before the following pulse of the primary beam. This places a severe limitation on the rate of data generation and sample throughput. The duration of the pulse must be severely limited in order for this approach to be effective.

Another complication arises from the dispersion of kinetic energies of particles from the same species released by the same pulse due to localized variations in conditions of sputtering and desorption from surface of the target and the angular dispersion of particles ejected from the target surface. This condition degrades the resolving power of the apparatus. A number of disclosures have appeared which are intended to make simultaneous the arrival at the detector of all particles from the same species from the same pulse and to compensate for energy and angular differences.

For example, U.S. Pat. No. 5,376,788 to Standing discloses a TOF mass spectrometer with resolution enhanced by producing electrical modulation of the kinetic energy imparted to the generated ions.

U.S. Pat. No. 5,128,543 to Reed discloses a TOFMS analyzer featuring two or more particle steering analyzers for compensating for the energies of same species particles thereby improving resolution. The three spherical steering analyzers rely on differentiating centripetal forces between the particles of same species but slightly different energies to redirect the path of the secondary beam by 270 degrees onto a detector plate.

TOFMS has been adapted to investigate targets which are gaseous and targets which are the surfaces of solid or liquid samples.

In the case of surfaces of solid samples, the technique has been extended to rastering the the primary beam over the target surface to accomplish individual localized analysis which can be displayed as an image or map of the lateral composition of the sample.

For example, U.S. Pat. No. 4,983,831 to Migeon discloses positioning deflector plates in the drift region to which a deflecting voltage to the secondary beam is applied. The secondary particles are discriminated by deflecting them at an angle which is variable periodically such that particles having a given time of flight are deflected in a predetermined direction irrespectively of the point on the target from which they have been liberated. Then the secondary particles moving in the predetermined direction are selectively detected. A limitation of this device is that only one species is detected.

The detector sensing the signal from the secondary beam (which is focused on a single detection location) is coupled to a CRT which translate the detected signal vs. time into a map on the CRT screen of the distribution of a single species on the target surface.

Other detection constructions are known in which a secondary particle originated from a location of an irradiated or illuminated target is mapped directly onto a surface of a detector. One such system uses a "position sensitive detector" which is available in several forms.

In one such form, the detector comprises a bundle of parallel capillary tubes with ends of the tubes forming the front detector surface. A beam of arriving secondary ions strike the inside surface of tubes in a localized area which are specially treated to generate electrons by secondary emission. The intensity of the secondary electrons is amplified as they travel to the far end of the tubes. At the rear surface of the array of tubes, the arrival is detected by a means which encodes the position of ion beam arrival. A direct indication of the intensity of the ion beam vs. illuminated sample position is available thereby.

Other disclosures have been published describing the use of deflection plates to improve resolution.

U.S. Pat. No. 5,347,126 to Krauss discloses injection of an ion beam into a pair of deflection regions separated by a drift space. The deflection regions include aperture plates such that pulses applied to deflection plates in the deflection regions cut off the forward and rearward end of the ion beam.

U.S. Pat. No. 5,300,774 to Buttrill discloses a a time of flight mass spectrometer in which a barrier defines an aperture in the path of the ion beam positioned to block ions having an extra large deviation of time of flight.

Disclosures have been published regarding approaches to increase rate of data throughput that is inherently limited in state of the art TOFMS apparatus by the time of flight difference between light and heavy particles.

U.S. Pat. No. 5,331,158 to Dowell discloses generating two secondary beams in tandem, each beam directed toward its own detector In one embodiment, two sources of primary beams are used, each generating its own secondary beam. In another embodiment, the primary beam is alternately directed in two separate directions by deflection in the ionizing chamber. Data generated by one primary beam is generated while the other primary beam is shut off The system is adapted to investigating gas sample targets injected into the ionization chamber. The construction requiring one primary beam for each secondary beams such as with a plurality of primary beam sources or even the the approach of deflecting the primary beam severely limits the number of discrete secondary beams that can be generated.

Various methods have been disclosed for preparing target surfaces for examination by TOFMS and each of these methods can present unique problems to implementing the TOFMS technique. For example, U.S. Pat. No. 5,360,976 to Young discloses preparation of a target surface by admitting a species to be examined as a gas into an evacuated ionization chamber having a cooled target surface so that the gas molecules are absorbed on the target surface. The molecules are then desorbed by bombardment with a primary beam. This technique is limited by the length of time that would be available before the supply of molecules is depleted.

SUMMARY

In view of the wide range of situations related to species composition, preparation of the target surface, population of the the species, etc., it is therefore an object of this invention to provide a TOFMS that extends novel approaches to studying this range of situations and, in particular, has a substantially increased rate of data generation and sample throughput compared to devices of the prior art.

This invention is directed toward a TOFMS apparatus in which the secondary beam is subject to a periodic deflection such that the secondary beam is incident on a pattern of locations on a detector surface. The intensity of the secondary beam at each location on the detector plate is analyzed according to TOF practice independent of the other locations.

The scope of the invention includes a variety of sources for the secondary beam. One source is gas fed into an ionization chamber where ions are generated such as by a primary beam of electrons or particles from nuclear fission. Another source is from a solid or liquid target having a target surface bombarded by a primary beam.

In one embodiment using a solid or liquid target, the pulsed primary beam is stationary (not rastered). but the secondary beam is continually deflected by a field to various positions on the detector surface. Each of the signals detected at all locations are simply displaced in time (phase) from one another so that by adjusting the phases and summing the signals an augmented signal is produced of all species in the target surface including revealing the presence of minor constituents in the target surface that might otherwise be undetected. Another advantage of the system is that data taking is performed continuously so that the rate of data generation and sample throughput is greatly increased.

In another embodiment, the primary beam is rastered over the target surface. Two secondary beam deflection waveforms are employed on two deflection plates. One waveform "derasters" the secondary beam to a single secondary beam and the other deflection waveform deflects the derastered beam onto the detection surface. This second embodiment of the invention is useful when it is required to examine an entire surface of the target.

The deflection field is performed by two pairs of deflection plates, one pair imposing a deflection field perpendicular to the deflection field of the other pair of plates. The deflection plates are preferentially located at the "cross over location" of the secondary beam which is the focal point of the first lens. Positioning the deflection plates at the cross over point avoids the secondary beam which otherwise occurs when the deflection plates are placed at other locations.

In the embodiment where the primary beam is rastered, a combination of two components of a force field deflects the secondary beam. One component of the force field "derasters" the secondary beam which is to say that the secondary beam is converted to a "unidirectional" beam from a multidirectional beam caused by the primary beam being rastered over the target surface. The second component of force field rasters the secondary beam over the detector surface.

In applying the two component force field, two sets of plates may be used, one for the "target anti-raster" field, and second set of deflection plates guide by side with the first plates for imposing the deflection field. Alternatively, the two field components may be imposed by one set of deflection plates.

The detector can be anyone of a number of kinds of position sensitive detectors such as the resistive anode encoder discussed in the BACKGROUND of this specification or an array of discrete detectors.

DISCUSSION OF PREFERRED EMBODIMENTS

Figure 1:
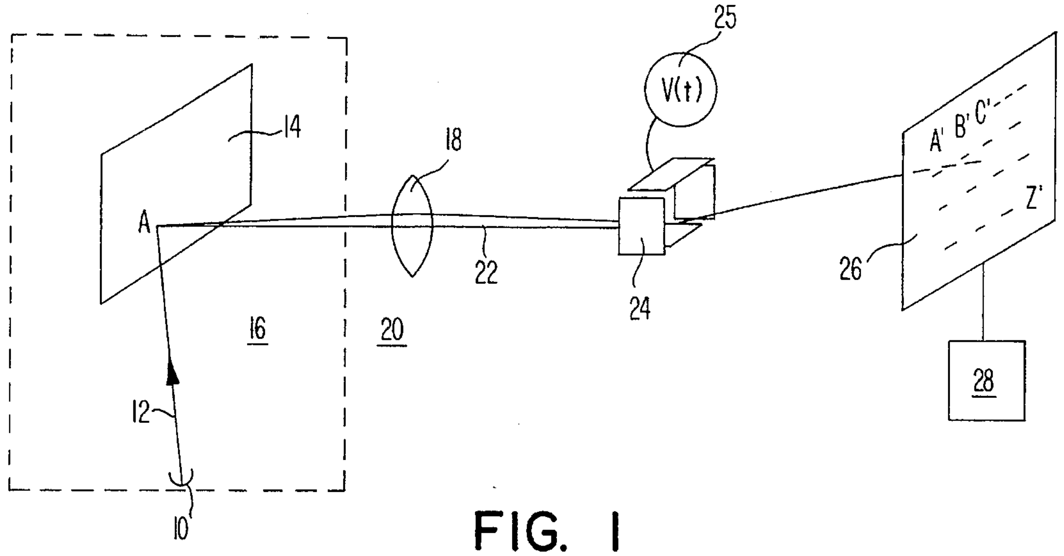
FIG. 1 shows an arrangement of the invention for a stationary primary beam.

Turning now to a discussion of the drawings, FIG. 1 shows a TOFMS of this invention including a source 10 for generating a primary beam 12 incident at location A on target surface 14. It will be understood that any one of the beams such as electron beams or fission products disclosed in the prior art may be used as a primary beam. Particles ejected from A that are ionized rate accelerated in chamber 16, focused by lens 18 then enter the drift region 20 as secondary beam 22. The secondary beam 22 passes between a pair of deflection plates 24 which subject the beam 22 to a time dependent deflection field from voltage source 25. The deflection field thereby causes the secondary beam 22 to strike the surface of a position sensitive detector 26 in a pattern of locations, A'–Z'. The signal at each location is transmitted to detection signal circuit 28 for further processing.

Figure 2:
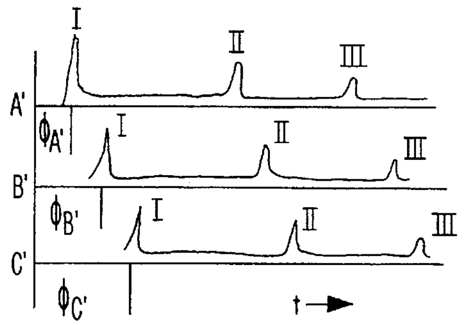
FIG. 2 shows data recorded by the invention.

FIG. 2 illustrates the character of the signals from the respective locations, A'B', C',–Z'. Each curve A'B'C'—is referred to as a "Group" signal which consists of a string of "species" signals. Each species signal I, II,—in any of the signals A', B',—represents arrival of a particular species at the respective location. It is noted that the Group signal at each location is substantially similar to the other Group signals except that it is displaced by phase according to time of arrival of the secondary beam at the respective location.

Figure 3:
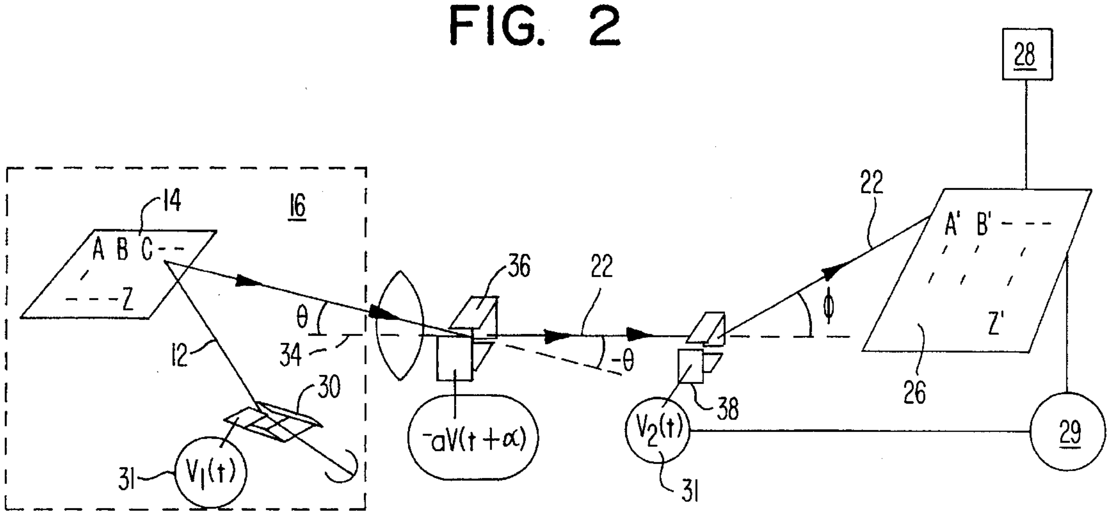
FIG. 3 shows the invention with rastering of the primary and secondary beams.

FIG. 3 shows another embodiment of the invention in which the primary beam 12 is rastered over the surface 14 of the target so that it is incident at an array of locations, A, B,–Z. The primary rastering operation is represented in FIG. 3 by passing the primary beam 12 between deflection plates 30 to which is applied deflection voltage $V_1(t)$ from source 31. The secondary beam 22 thereby makes an angle 0 (t) with centerline 34. The secondary beam 22 passes through a first pair of secondary beam deflection plates 36 imposing an anti rastering field on the secondary beam 22 thereby aligning the secondary beam with the centerline 34. Then the beam 22 passes between a second pair of secondary beam deflection plates 38 which rasters the secondary beam 22 onto the detector surface 26 at locations A', B',–Z' In the embodiment of FIG. 3, each group signal A', B'—represents composition at respective locations A, B,—on the target surface.

In a variation of the embodiment discussed in the foregoing paragraph, each pixel on the sample is irradiated by more than one pulse in succession so that groups of particles are ejected in succession from one pixel. Each group of particles (each group represented by $A_n$) and the series of groups $A_1$, $A_2$,—from one pixel are distributed on the detector plate at locations $A'_1$, $A'_2$—.

The anti rastering field generated by the anti rastering plates 36 has a similar form to the primary rastering field generated by the primary rastering plates 30 except that: it is displaced in time to account for the time required by the secondary particles to reach plates 36;

it has a sign depending on the sign of the secondary beam ions that is necessary to bring the secondary beam into a single line for deflection by the deflection plates;

it has an amplitude consistent with deflecting the secondary beam whose particles may be more or less energetic than the particles of the primary beam.

An alternate arrangement to the two sets of deflection plates is to have both the field and the secondary beam rastering field applied by a single pair of deflection plates.

The collection of signals arriving at locations A', B',—on the detector plate in any of the arrangements FIGS. 1, or 2 is processed according to any one of a number of applications.

A major feature of the invention is the effectively continual supply of data without having to wait for the slowest particles to be detected as in state of the art TOFMS.

In order to discuss the concepts underlying application of the invention, it is useful to define the following parameters.

1. The "instant of ejection" is defined as the instant when the secondary particles from a primary beam pulse start their journey from the target surface.

2. The "reference detector location" is a location on the detector surface which will be the spatial origin or reference point for all the other locations. For example, if location on the detector surface is defined by two arbitrarily selected coordinates, x and y, then the "reference detector location " would be x=0 and y=0.

3. The "drift period" of each species particle is the time required for the secondary particle to travel from the target surface to the detector surface.

4. The "cycle time" is defined to be the time between when secondary particles strike the reference location then strike all the other detector locations, then strike the reference location again. The cycle time must be longer than the drift period of the heaviest secondary particle.

5. The "species signal" is defined as being the signal (or peak) generated at a detector location by one collection of species particles generated at a "single instant of ejection".

6. A "group signal" is defined as the entire collection of species signals generated from all secondary particles issuing at one "instant of ejection".

7. The "phase" time of a group signal equals the period between the "ejection instants" of the "reference detector location" and the ejection time of the group.

One application of the arrangement of FIG. 1 is where it is desired to amplify the "species signals" particularly when it is required to detect trace amounts of a particular species (assuming fixed primary beam intensity). According to the arrangement of the prior art, this would be accomplished by repeatedly sending pulses of a primary beam where the time between pulses must be longer than flight time of the slowest species particle and accumulating the signal from a sufficient number of pulses until the species signal was measureable. This would require a time equal to the sum of a plurality of times between pulses at least equal to a plurality of times of the longest drift time. According to the present invention, numerous primary beam pulses (equal to the number of detector locations) can be applied during ONE drift time of the slowest particle. The "group signal" from each detector location is shifted by a period between the ejection instant of the reference location and the ejection instant of the respective location so that all of the "species" signals of a single species from all locations coincide thereby permitting simple addition of all the species signals such as to amplify the species signal. The amplified signal is thereby gotten during a period only a little longer than the longest flight time.

The foregoing embodiment can be performed using a stationary location on the target surface or a rastered target surface.

The foregoing technique may be used with a pulsed primary beam, in which case the deflection wave form would be stepped pulses where each step is applied to one pulse respectively or a continuous primary beam in which case the deflection voltage would be applied as a continuous waveform.

A schematic diagram of a detector circuit for practicing the foregoing application described above is shown in FIG. 7. There is shown a secondary beam 60 incident on an array of detectors 70. Detector "A" is selected as the "reference detector location". Each detector location (A,B,–Z) is connected to an A/D convertor 71 and the digitized signals are delayed by respective delays 62. The value of each delay 62 equals the phase time of the corresponding detector 70. The delayed outputs from all of the detectors 70 are added by adder 74 which outputs an amplified group signal. The output from the adder is then applied to the vertical deflection terminals of a scope 76 whose horizontal terminals are connected to clock 75 whose period is set to sweep the horizontal terminals by deflection signal generator 79 connected to deflection plates 77 once per cycle of the deflection signal.

Figure 8:
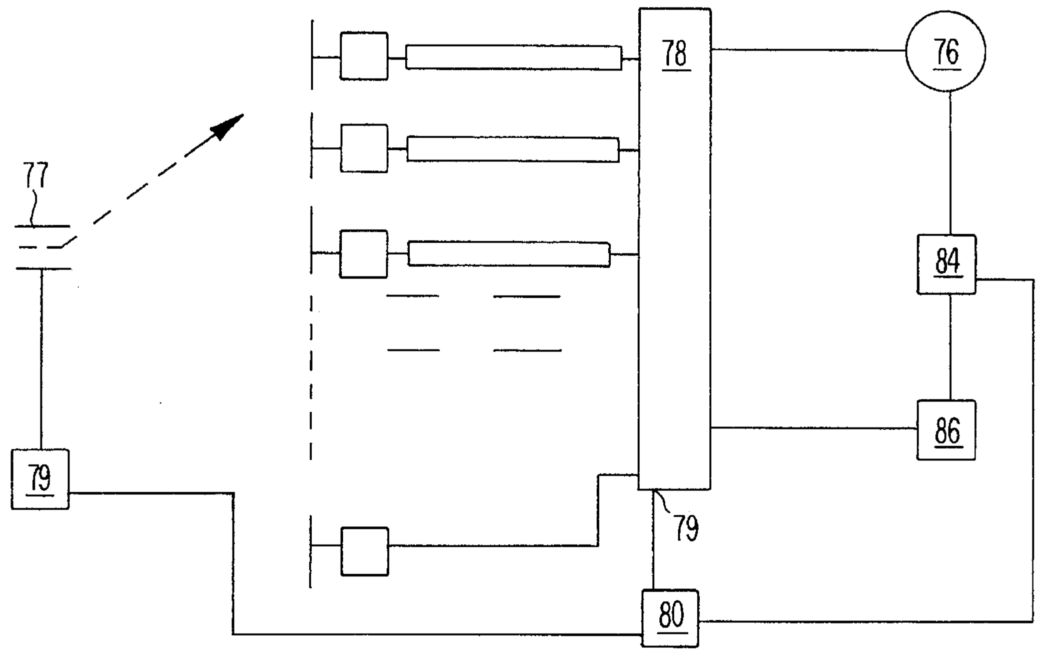
FIG. 8 shows a schematic circuit for displaying species concentrations.

Another embodiment provides for continuous display of a species concentration and is especially useful In situations such as when using the molecular technique discussed in connection with U.S. Pat. No. 5,360,976 in the Background. Here it is required to know rate of desorption, and the time of depletion of a species whose lifetime on the target surface is comparable to the flight time of the slowest particle. Another application would be in studying sputtering rates from a multicomponent target where rate of departure of a species from a target surface would be determined by diffusion rates of the species. A circuit for practicing this application is shown in FIG. 8. In this arrangement, the primary beam (not shown in FIG. 8) is a continuous or pulsed beam hitting one spot on the target surface and the species of interest is being continually depleted during bombardment. The group signal from each detector location 70 is delayed by the respective phase time by one of delays 62 so that the group signal from each delay 62 appears at the output of the respective delay in time coincidence with all the other group signals. The delayed group signal from each delay 62 is then applied to one of parallel terminals of a parallel-to-serial multiplexer having a gate terminal 79 which receives a pulse from deflection waveform clock 80 once during every deflection cycle period to update the group signal applied to the multiplexer 78. The phase of the pulses from clock 80 is selected according to the species of interest so that the concentration of a selected species is entered onto each of the multiplexer input terminals according to the time of departure DURING THE CYCLE PERIOD from the target surface. The serial output terminal of the multiplexer 78 is connected to the vertical deflection terminals of a scope 82. A timing clock 84 is connected for stepping the output of the multiplexer 78 and for stepping the scope beam horizontally so that a graph of selected species concentration vs. time is presented on the scope screen.

The embodiment of FIG. 3 (rastered target surface) is useful if it is required to know the average composition over the entire target surface. Each signal is shifted in time to a common origin of time and the signals are added as discussed above in connection with FIG. 1.

Figure 7:
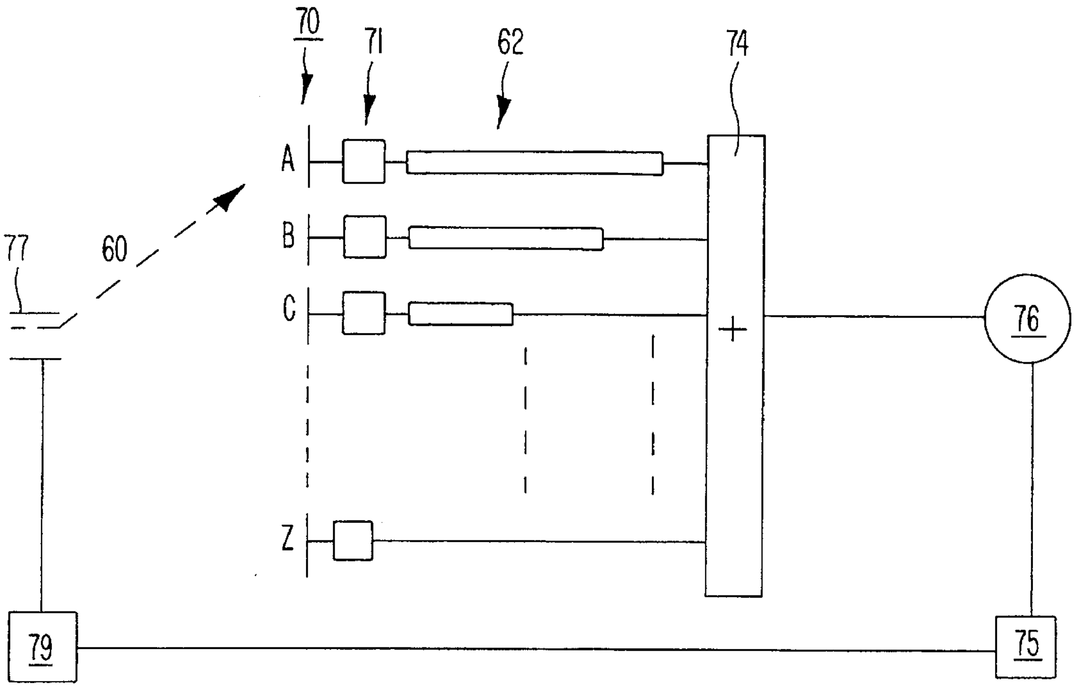
FIG. 7 shows a schematic circuit for summing group signals.

FIG. 3 also shows an arrangement of reflection which, together with the detection electronics of FIG. 7 can be used to map the distribution of composition for a selected species on the target surface and display on the screen of a CRT. 29. In this case, the group signal at each terminal of the multiplexor (FIG. 7) represents the composition of the respective pixel (location) on the target surface. Therefor, x y coordinates of the target surface and detector surface 26 are mapped onto the screen of the CRT by signals to the CRT 29 from the rastering signal 31. Simultaneously, the intensity of a selected species stored in the multiplexor 78 for each group signal is applied by timing clock 86 to the Z axis of the CRT so that brightness of an area corresponds to concentration of species in that area.

In another version of this embodiment, the digital signal representing concentration is converted to decimal (converter not shown in FIG. 7) and the numbers are projected onto the screen equivalent to signal amplitude so that quantitative information of concentration distribution is displayed.

Figure 4:
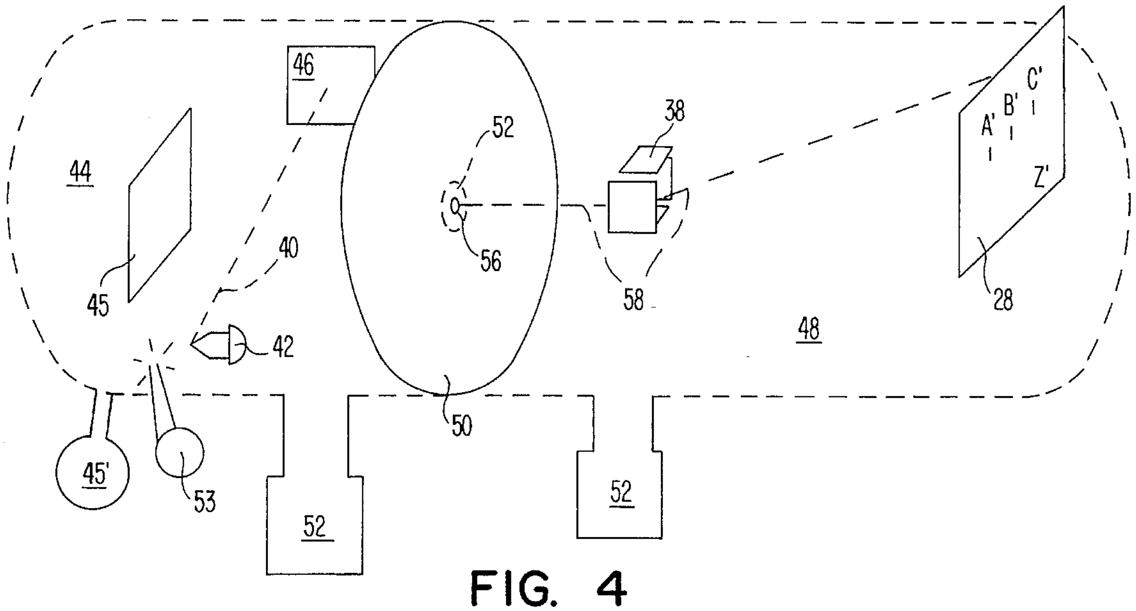
FIG. 4 shows an embodiment for gases.

FIG. 4 shows an embodiment of the invention for studying the composition of gases. There is shown an electron beam 40 originating from cathode 42 directed through an ionization chamber 44 toward a collection plate 46. The ionization chamber 44 is separated from the drift region 48 by a chamber wall 50. Vacuum system 52 evacuates the drift region 48 and the ionization chamber 44 separately so that gas admitted into ionization chamber 44 by controllable leak 45 does not accumulate in the drift region 48 Wall 50 is an insulator however a small anode 52 is centered on the insulator wall 50. The accelerating anode 52 on ionization side of the wall 50 is opposite a pusher plate 45 on an opposite side of the ionization chamber 44. The accelerating anode 52 and wall 50 have a small aperture 56 so that some of the ions formed in the ionization chamber 44 pass through the aperture 56 thereby forming the secondary beam. 58. The secondary beam 58 passes between deflection plates 38 in the drift region 48 which rasters the secondary beam 58 on detector plate 26.

The embodiment of FIG. 4 is useful where a high rate of data throughput is required when analyzing gas samples. This could be particularly useful when it is required to measure reaction rates in mixtures of gases. In one situation, the mixture of gases is introduced into the ionization chamber and reaction is initiated such as by a spark discharge from spark source 53 that initiates a timing cycle of the secondary rastering voltage. Progress of the reaction involving the gases in the ionization chamber is monitored by the succession of signals received at the detector locations, A', B',—.

In the foregoing paragraphs, a novel method and apparatus for analysis by TOFMS has been described which has numerous variations applicable to a variety of situations. Other variations may be suggested by reading the specification and studying the drawings that are within the scope of the invention.

Figure 5:
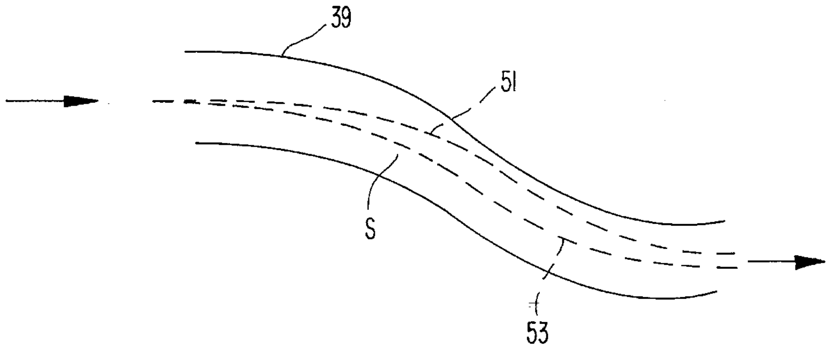
FIG. 5 shows a crowed deflection plate for energy compensation.

For example, FIG. 5 shows the deflector plates 39 for the drift region 48 having a curvature to generate centripetal force on the particle beam such as compensate for energy differences between same species particles.

Figure 6:
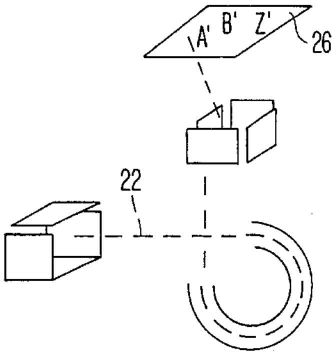
FIG. 6 shows a system with energy compensation.

Alternatively, as shown in FIG. 6, the drift region 48 may have energy compensating devices 53 (well known in the art) between the a set of deflection plates 57 that eliminate the rastering effects of the primary beam and a second set of deflection plates 55 that raster the secondary beam 22 onto the detector surface 26.

The secondary beam may be a continuous beam or a beam of pulses. In the discussions above concerning groups of secondary particles generated by pulses from a primary beam, it is understood that the time between pulses may be reduced to the point where the leading eand forward edge of successive pulses respectively are so close to one another that the beam is a continuous beam.

The primary beam may be any one of beams (electron beam, fisson particles, etc.) known in the art.

The position sensitive detector may be any of the types that are known in the art.

In view of the various modifications that may be considered, I therefore wish to define the scope of my invention by the scope of the appended claims and in view of the specification if need be.

We claim:

1. A mass spectrometer for analyzing concentration of chemical species in a sample which comprises:

generating means for generating a secondary beam of groups of ionized particles from said sample:

each said group containing substantially all said species of particles;

each said group ejected from said sample at a respective instant of ejection, each particle in each group having a kinetic energy common to each particle belonging to all said groups; a position sensitive detector means having a detector surface for detecting said ionized particles incident on said detector surface located in a drift region;

means for directing said secondary beam into said drift region toward said detector surface;

a deflection plate means located in said drift region for deflecting said secondary beam such that each said group of particles strikes a respective detector location of a plurality of detector locations on said detector surface once during a cycle period;

means for generating a plurality of group signals, each group signal generated by one of said groups striking one of said locations respectively;

each said group signal being a succession of species signals, each species signal occurring at a time after said instant of ejection of said respective group that is proportional to a square root of a mass of a particle belonging to said respective species signal;

each said species signal having an amplitude that is responsive to a population of said species in said respective group.

2. The mass spectrometer of in claim 1 wherein said generating means generates said secondary beam of groups which is one of:

(I) each said group being separated in time from a successive group such that said secondary beam is a succession of discrete groups;

(2) each said group being separated in time from a successive group wherein said time is so sufficiently short that said secondary beam is substantially a continuous beam.

3. The mass spectrometer of claim 1 wherein said means for directing has a focal location in said drift region and said deflection plate means is located in said focal location.

4. The mass spectrometer of claim 1 wherein said deflection plates are located proximal to said focal location.

5. The mass spectrometer of claim 4, further comprising means for creating a selected species signal generated at any instant during a cycle period of a waveform applied to said deflection plates.

6. The mass spectrometer of claim 5 wherein said means for creating comprises:

a parallel to serial multiplexer means for storing said species signals having a plurality of input terminals, each said input terminal being connected to an output terminal of a respective one of a plurality of delays permitting said group signal in phase with said group signals from all said delays to be applied to each input terminal of said multiplexer;

a species clock emitting a timing pulse to a gate terminal of said multiplexer means such as to enter a selected updated species signal;

said species clock emitting said species timing pulse at a phase in said cycle period corresponding to said selected species; and means for displaying said updated species signal stored in said multiplexer means.

7. The mass spectrometer of 6 wherein said means for displaying comprises one of:

(ii) a recorder; and (iii) a tape;

said means for displaying having a vertical deflection input terminal and a horizontal deflection terminal; and further comprising;

a means for generating a horizontal deflection wave form applied to said horizontal deflection terminal and for stepping said species signals stored in said multiplexer to an said output terminal of said multiplexer means;

said vertical deflection terminal of said means for displaying connected to said output terminal of said multiplexer.

8. The mass spectrometer of claim 5 wherein said means for creating comprises:

display screen:

circuit means connected to said display screen, said detector means and said deflector means in operable arrangement such that said selected species signal from each said group signal is displayed as one of:

(i) intensity (ii) a number representing concentration of said respective specie;

said species signal displayed on said screen at a location corresponding to a respective location on a target surface of said sample whereby distribution of said selected species on said target surface is displayed on said screen.

9. The mass spectrometer of claim 1 further comprising:

a plurality of delay means;

each delay means connected to one of said detector location for delaying said respective group signal:

each said delay means delaying said respective group signal by a period between said instant of ejection of said respective group and a group ejected from a reference detector location whereby each said group signal is brought into time coincidence with said other group signals.

10. The mass spectrometer of claim 9 wherein said sample is a target having a said means for generating comprises a primary beam directed against a localized location said surface of said target further comprising:

means for adding all said delayed group signals such as to produce an amplified group signal representing composition of species at said localized location.

11. The mass spectrometer of claim 9 wherein:

said sample is a target having a surface;

said means for generating comprises a primary beam rastered over said surface of said target and further comprising:

means for adding all said delayed group signals such as to produce an amplified group signal representing average distribution of each said species over said target surface.

12. The mass spectrometer of claim 11 further comprising a scope having a vertical detection terminal connected to output terminals of said means for adding and horizontal deflection terminals connected to a means for applying horizontal deflection signal timed with said detection plate means such as to display a curve representing said amplified group signal on a screen of said scope.

13. The mass spectrometer of claim 11 wherein said means for generating comprising a primary beam of charged particles being is one of:

(1) an electron beam;

(2) an ion beam; and (3) a beam of fission particles.

14. The mass spectrometer of claim 1 wherein said sample is a target having a surface and said means for generating comprises a primary beam directed against a localized location on said surface of said target.

15. The mass spectrometer of claim 1 wherein said sample is a target having a surface and said means for generating comprises a primary beam rastered over said surface of said target whereby said group signal is generated at each detector location corresponding to concentration of species at a respective location on said surface of said target.

16. The mass spectrometer of claim 15, wherein said primary beam is one of:

(1) a beam of fission particles;

(2) a laser photon beam; and (3) a charged particle beam.

17. The mass spectrometer of claim 16 wherein said charged particle beam is one of:

(1) an ion beam; and (2) an electron beam.

18. The mass spectrometer of claim 15 wherein said means for deflecting comprises:

first means for deflecting said secondary beam such that a direction of said secondary beam is rendered independent of said primary rastered beam and second means for deflecting said secondary beam such that said secondary beam is rastered onto said deflector surface.

19. The mass spectrometer of claim 18 further comprising an energy compensating means positioned between said first and second means for deflecting.

20. The mass spectrometer of claim 1 wherein said generating means comprises:

an ionization chamber means for containing a gas;

an evacuation means for evacuating said ionization chamber;

an ionization means for ionizing said gas in said chamber;

a wall between said ionization chamber and said drift region;

an aperture in said wall such that said ionization chamber communicates with said drift region through said aperture means adapted for ejecting ions from said ionization chamber through said aperture into said drift region whereby said secondary beam is formed.

21. The mass spectrometer of claim 20 further comprising means for evacuating said drift region.

22. The mass spectrometer of claim 20 wherein said ionizing means comprises a primary beam of charged particles.

23. The mass spectrometer of claim 20 wherein said ionizing means comprises a photon beam.

24. The mass spectrometer of claim 20 wherein said means for ejecting comprises:

a first electrode plate on said wall separating said ionization chamber and said drift region said aperture extending through said electrode plate;

a second electrode plate in said ionization chamber spaced from said first electrode plate and facing said first electrode plate;

means for imposing all electric field between said first and second electrodes such that said ions generated in said ionization chamber are directed through said aperture into said drift region.

25. The mass spectrometer of claim 20 further comprising:

said means for ionizing is a spark discharge means to initiate a reaction in said gas when said gas is a mixture of gases; and triggering means for activating said spark means and simultaneously initiating a voltage applied to said deflection plate means to raster said secondary beach on said detector surface.

26. The mass spectrometer of claim 1 wherein said sample is one of:

(i) a solid having a target surface;

(ii) a liquid having a target surface; and said generating means comprises a primary beam incident on at least one location on said target surface and at least one of said groups is generated in succession from each one of said at least one location of said surface and each one of said groups ejected from said each one of said at least one location on said target surface is incident on a location of said detector surface such that each said location of said detector surface is struck by only one group during a cycle period.

27. A method for analyzing concentration of chemical species in a sample which includes in operable order the steps:

(a) generating a secondary beam of groups of ionized particles, one group after another group, from said sample wherein each said group contains substantially all said species of ionized particles and each said group is ejected from said sample at a respective instant of ejection such that each particle in each said group has a kinetic energy substantially common to each particle belonging to all said groups;

(b) directing said secondary beam into a drift region toward a detector surface of a position sensitive detector;

(c) rastering said secondary beam onto said detector surface such that each said group of said ionized particles strikes a respective location of a plurality of locations on said detector surface;

(d) recording a plurality of group signals, each group signal generated by one of said groups striking one of said locations respectively wherein each group signal is a succession of species signals, each said species signal occurring at a time after said instant of ejection of said respective group that is proportional to a square root of a mass of a particle belonging to said respective species and each species signal having an amplitude that is responsive to a population of said species in said respective group.

28. The method of claim 27 wherein said sample is a solid having a target surface and said generating step (a) includes the step of directing a primary beam against said target surface such as to generate ions for said secondary beam.

29. The method of claim 28 wherein said generating step (a) further includes the step of rastering said primary beam on said target surface and said rastering step (c) includes the step of imposing a deflecting field on said secondary beam such that a direction of said secondary beam is rendered independent of said rastering step on said primary beam.

30. The method of claim 27 wherein said sample is a gas and said generating step includes the step of directing a primary ionizing beam through said gas.

31. The method of claim 27 wherein said sample is a gas containing constituents that react when a spark is generated in said gas and said generating step includes the step of generating a spark in said gas and simultaneously initiating a rastering voltage to generate group signals of said constituents that have reacted when said spark is generated in said gas.

* * * * *